United States Patent
Fan

(10) Patent No.: US 6,456,164 B1
(45) Date of Patent: Sep. 24, 2002

(54) SIGMA DELTA FRACTIONAL-N FREQUENCY DIVIDER WITH IMPROVED NOISE AND SPUR PERFORMANCE

(75) Inventor: Yiping Fan, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/800,118

(22) Filed: Mar. 5, 2001

(51) Int. Cl.[7] .............................. H03L 7/18; H03B 19/00
(52) U.S. Cl. ..................... 331/16; 331/1 A; 327/115; 327/159
(58) Field of Search ............................ 331/1 A, 16, 18, 331/25; 327/105–107, 115, 117, 156–159

(56) References Cited

U.S. PATENT DOCUMENTS

| | | | |
|---|---|---|---|
| 5,055,802 A | 10/1991 | Hietala et al. | 331/16 |
| 5,070,310 A | 12/1991 | Hietala et al. | 331/1 A |
| 5,604,468 A | 2/1997 | Gillig | 331/176 |
| 5,889,436 A | * 3/1999 | Yeung et al. | 331/2 |
| 5,920,233 A | 7/1999 | Denny | 331/14 |
| 6,157,694 A | * 12/2000 | Larsson | 377/48 |
| 6,310,498 B1 | * 10/2001 | Larsson | 327/158 |
| 6,329,850 B1 | * 12/2001 | Mair et al. | 327/107 |

* cited by examiner

Primary Examiner—David Mis
(74) Attorney, Agent, or Firm—Michael Schmitt

(57) ABSTRACT

A frequency synthesizer is provided that allows for a half-cycle division of the synthesized frequency. In a conventional sigma-delta fractional-N frequency synthesizer, a controllable divider is configured to allow for the division of the synthesized frequency by an integer factor of N or an integer factor of N+1. A sigma-delta calculator controls a half-cycle divider so as to selectively divide the synthesized frequency by an integer factor of N, or a fractional factor of (N+½). If a higher order sigma-delta calculator is employed that provides S output symbols, the half-cycle divider is correspondingly controlled to select a division factor of (N+s/2), where s is selectable from set of S symbols.

11 Claims, 3 Drawing Sheets

SIGMA DELTA FRACTIONAL-N FREQUENCY DIVIDER WITH IMPROVED NOISE AND SPUR PERFORMANCE

BACKGROUND OF THE INVENTION

1. Field of the Invention

This invention relates to the field of signal processing, and in particular to a Sigma-Delta Fractional-N divider that provides resolution with a step size of a half clock cycle.

2. Description of Related Art

In a Sigma Delta fractional-N frequency synthesizer, a fractional dividing ratio is achieved by averaging a time series, termed a sigma-delta sequence, which is generated by sigma-delta modulation. If the desired ratio is between the integers N and N+1, the input signal is divided by N at some periods, and divided by N+1 for other periods. The relative number of times the clock is divided by N, compared to the number of times that it is divided by N+1, determines the average frequency of the output signal. If, for example, the input signal is alternately divided by N, then N+1, then N, and so on, the average divider output frequency will be the frequency of the input signal divided by (N+0.5). If the input signal is divided more often by N than by N+1, the divisor will be less than (N+0.5); if it is divided more often by (N+1), the divisor will be greater than (N+0.5).

Higher order sigma-delta fractional-N frequency synthesizers are known in the art, wherein the choice among integer divisions is not limited to the choice between N and (N+1). In a higher order sigma-delta fractional-N frequency synthesizer, the integer division may be selected from among a set of integers N+s, where s is an integer, for example, with the range of −1 to +2 for a second order ($2^2$ selections) sigma-delta device, and −3 to +4 for a third order ($2^3$ selections) device, and so on. An example second-order sigma-delta calculator is illustrated in FIG. 3. A first order ($2^1$ selections) sigma-delta fractional-N frequency synthesizer is presented herein as a paradigm for ease of understanding of this invention.

FIG. 1 illustrates an example block diagram of a conventional fractional-N frequency synthesizer 100 that is configured in a phase-locked loop configuration. A phase comparator 110 detects a difference between a reference input signal and a feedback signal from a fractional-N divider 140. This difference is filtered by a loop filter 120, and the filtered difference controls the output frequency of a voltage-controlled oscillator 130. The output signal of the oscillator 130 is fed back to the fractional-N divider 140, to be divided by either N or N+1, as discussed above, via the integer divider 150. The control of whether the integer divider 150 divides by N or by N+1 is provided by a sigma-delta calculator 160, discussed further below. The phase-locked loop of the synthesizer 100 is designed to minimize the phase difference between the input reference signal, and the frequency-divided output signal of the fractional-N divider 140. If the dividing ratio is exactly N, the output frequency from the voltage controlled oscillator 130 will be N times the input reference frequency. If the dividing ratio is alternately N for three periods, then N+1 for one period, then N for three periods, etc., the output frequency will be (N+0.25) times the input reference frequency, the (N+0.25) term being the average of the four repeating periods (3*N+1*(N+1))/4.

The sigma-delta calculator 160 controls whether the integer divider 150 effects a divide-by-N operation, or a divide-by-(N+1) operation. At each cycle of the frequency-divided output, a constant value K, corresponding to a fractional dividing ratio, is added to an intermediate sum, and an output pulse is produced whenever a carry term is produced from this addition. This output pulse effects the division by (N+1); if the output pulse is not asserted, the divider 150 divides by N. If the fractional component is small, such as 0.1, a carry is rarely generated; in this example, only once per ten cycles, and thus the divider 150 will provide nine divisions by N for each one division by (N+1), thereby producing an average division by (N+0.1). Whereas, if the fractional component is large, such as 0.9, a carry is generated frequently; in this example every nine out of ten clock cycles will effect a division by (N+1) and only one division by N, thereby producing an average division by (N+0.9).

In this process of providing a fractional division via a series of integer division with different divisors, a systematic phase shift is introduced by the series of integer divisions that are used to effect the fractional division. In the example of nine divisions by N, followed by a division by (N+1), at each division by N, the frequency-divided output signal will increasingly lead the reference signal; then, at the divide-by-(N+1) period, the output signal will be delayed by an "extra" clock cycle, allowing the reference signal to "catch up". Optionally, the sigma-delta calculator 160 may be configured to compensate, via the loop filter 120, for this systematic phase shift, as indicated by the dotted line between the two. The aforementioned intermediate sum provides an indication of the amount of lead or lag of the frequency-divided output signal, and is provided to the loop filter 120, or to the phase detector 110, to compensate for this fractional-division, using techniques common in the art.

The correction of the systematic phase shift, as well as the accurate generation of a feedback signal that corresponds to the differences between the reference signal input and the output of the frequency divider, is highly dependent upon the linearity of the components used to provide the mapping between phase-difference and the correction voltage that corresponds to the correction of this phase-difference. When a circuit is non-linear, the non-linear effect will typically be more evident for an input signal with a large span of values, than for an input signal with a relatively small span of values, because the non-linear effect may be substantially 'piece-wise' linear over a small span. Thus, a phase difference that spans a wide range can introduce multiplicatively worse affects when processed via conventional devices that exhibit some non-linearity.

As is known in the art, for the same output frequency, a higher reference clock frequency will result in a better noise and spur performance, as well as a faster response time. In the frequency domain, the aforementioned periodic "catch-up" corresponds to a 'spur' on each side of intended output frequency, the distance of the spur from the output frequency being determined by the frequency of the periodic catch-ups. A higher reference clock frequency results in a higher frequency-divided output signal. The higher frequency-divided output signal provides for more frequent increments of the aforementioned intermediate counter, thereby effectively allowing for smaller cumulative phase shifts. For example, if the reference clock is doubled, the aforementioned 9-out-of-10 ratio of divide-by-N periods to total periods becomes an 18-out-of-20 ratio. During this 18-out-of-20 sequence, however, the first divide-by-(N+1) period will occur after nine divide-by-N periods. That is, the sigma-delta calculator 160 will provide twice as many assertions of the divide-by-(N+1) command during the same overall time period, and thus the frequency of "catching up" to the accumulating systematic phase error is doubled. Effectively, the accumulating systematic phase error is reduced in half. Depending upon the configuration of the phase locked loop 100, this halving of the systematic phase error can provide a multiplicative reduction in noise and spur performance. In addition to reducing the magnitude of the systematic phase error, thereby making the synthesizer less sensitive to the aforementioned non-linear effects of conventional components, a higher catch-up frequency provides a larger separation between the spurs and the desired output frequency component, thereby easing the task of filtering the spurs from the desired output frequency component. Providing a higher frequency reference clock also increases the achievable resolution in the fractional divider. In the aforementioned increase from 10 to 20 reference cycles per cycle, for example, the inherent resolution improves from 0.1 (1/10) to 0.05 (1/20).

Providing a higher reference frequency reference clock, however, is often not feasible. In some applications, the EMI (ElectroMagnetic Interference) or RF (Radio Frequency) separation constraints preclude a higher frequency. In other applications, the higher power consumption of a higher frequency clocking system provides a practical upper-limit to the frequencies that can be employed.

BRIEF SUMMARY OF THE INVENTION

It is an object of this invention to provide a sigma-delta fractional-N frequency synthesizer having improved noise and spur performance. It is a further object of this invention to provide a sigma-delta fractional-N frequency synthesizer having improved noise and spur performance without a corresponding increase in the frequency of the reference clock signal. It is a further object of this invention to provide a sigma-delta fractional-N frequency synthesizer having improved noise and spur performance and reduced power consumption. It is a further object of this invention to provide a sigma-delta fractional-N frequency sythesizer having improved resolution.

These objects and others are achieved by providing a frequency synthesizer that allows for a direct fractional division of the synthesized frequency. Specifically, the frequency synthesizer allows for a half-cycle division of the synthesized frequency. In a conventional sigma-delta fractional-N frequency synthesizer, a controllable divider is configured to allow for the division of the synthesized frequency by an integer factor of N or an integer factor of N+1. A sigma-delta calculator of this invention controls a half-cycle divider so as to selectively divide the synthesized frequency by an integer factor of N, or a fractional factor of (N+½). If a higher order sigma-delta calculator is employed that provides S output symbols, the half-cycle divider is correspondingly controlled to select a division factor of (N+s/2), where s is selectable from set of S symbols.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE INVENTION

Figure 2:
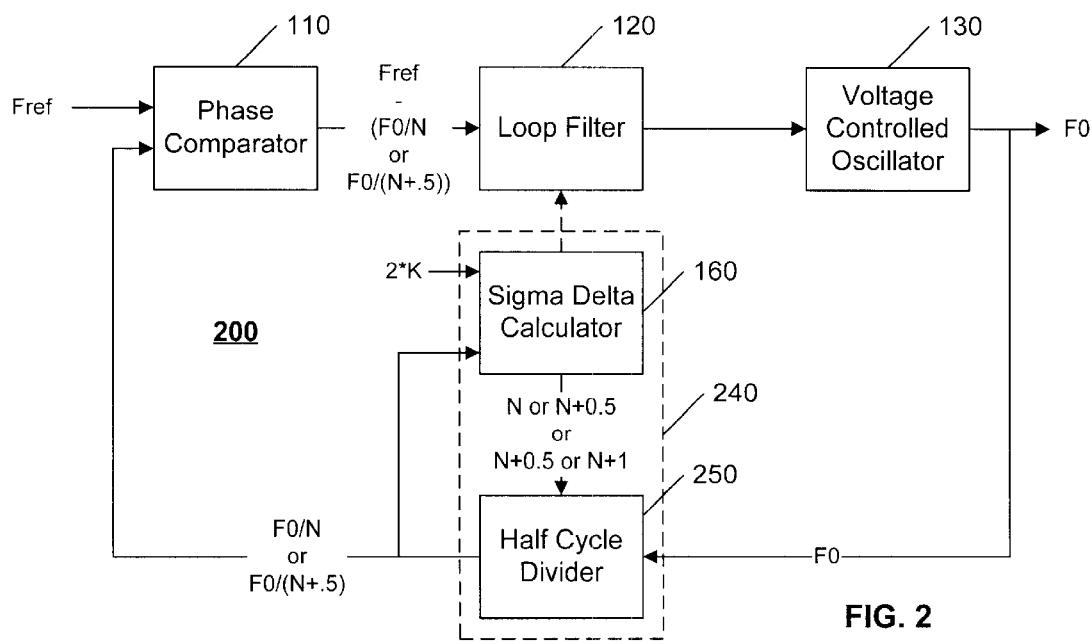
FIG. 2 illustrates an example block diagram of a sigma-delta fractional-N frequency synthesizer in accordance with this invention.

FIG. 2 illustrates an example block diagram of a sigma-delta fractional-N frequency synthesizer 200 in accordance with this invention. Using the example of a first order sigma-delta calculator, the fractional-N divider 240 of this invention is configured to selectively divide the output of the voltage controlled oscillator 130 by either N or N+½ for fractional components less than 0.5, or, by either N+½ or N+1 for fractional components greater than 0.5. That is, in a conventional fractional-N divider 140, the divisor either includes or does not include an additional (+1) clock cycle. In the fractional-N divider 240 of this invention, the divisor either includes or does not include an additional half (+½) clock cycle. By using half the conventional step size of the selection between divisors, the magnitude of the systematic phase error is reduced in half, and the frequency of the periodic 'catch-up' cycles, or spurs, is doubled. To effect this frequency doubling, the fractional constant K provided to the sigma-delta calculator 160 is doubled, thereby doubling the aforementioned occurrences of a carry signal from the intermediate sum in the calculator 160. (As is known in the art, an odd fractional constant generally provides better spur performance, by reducing repetitions, compared to an even fractional constant. In a preferred embodiment, a fractional constant of 2*K+/−1 is used in lieu of 2*K, to provide the odd fractional constant. The constant of 2*K is illustrated for ease of understanding.)

To effect the half cycle divider 250, the generation of the frequency divided output of the divider 250 is selectively controlled by either the positive-edge or negative-edge of the input signal from the voltage controlled oscillator 130. A preferred embodiment of a half-cycle divider 250 that is particularly well suited for use with a higher-order sigma-delta calculator is presented in FIG. 4, discussed below.

In the aforementioned divide-by-(N+0.1) example, which is conventionally provided by nine divide-by-N periods followed by one divide-by-(N+1) period, the frequency synthesizer 200 of this invention will effect a four divide-by-N periods followed by one divide-by-(N+½) period. The average frequency will be (4*N+1*(N+0.5))/5, or N+0.1, as desired. Note, however, that the systematic phase error in this example is returned to zero (the aforementioned "catch-up" period) every five periods in the synthesizer 200, as compared to every ten periods in the synthesizer 100.

In like manner, a divide-by-(N+0.75), for example, which is conventionally provided by three divide-by-(N+1) periods and one divide-by-N period, will be provided by one divide-by-(N+1) period followed by one divide-by-(N+½) period, for an average frequency of (1*(N+1)+1*(N+½))/2, or N+0.75, as desired. Note, however, that the systematic phase error in this example is returned to zero every two periods in the synthesizer 200, as compared to every four periods in the synthesizer 100.

Similarly, a divide-by-(N+0.5) is effected directly by the half-cycle divider 250 of the synthesizer 200 of this invention, thereby introducing no systematic phase error, as compared to a conventional synthesizer 100, which effects a divide-by-(N+0.5) by alternative divide-by-N and divide-by-(N+1) periods, having a systematic phase error that is returned to zero every two periods. Alternatively stated, the synthesizer 200 of this invention has twice the inherent resolution of a conventional synthesizer 100, and thus errors caused by approximating finer resolution by fractional averaging are substantially reduced, and in some cases, eliminated.

For the same output frequency and reference clock, the periodic reduction of the systematic phase error to zero in the frequency synthesizer 200 of this invention occurs twice as often the periodic reduction of the systematic phase error in the conventional frequency synthesizer 100 of the prior art. That is, the spur frequency of the synthesizer 200 is twice the spur frequency of the conventional frequency synthesizer 100, and the magnitude of the systematic phase error of the synthesizer 200 is half that of the conventional frequency synthesizer 100. As noted above, the reduction in the magnitude of the systematic phase error provides for a multiplicative advantageous effect, particularly because of the presence of non-linearities in the performance of actual circuit components. As also noted above, the increased spur frequency places the spurs farther from the desired output frequency, thereby reducing the difficulty of filtering the spurs from the desired output. These advantages and others will be evident to one of ordinary skill in the art in view of this disclosure.

Figure 3:
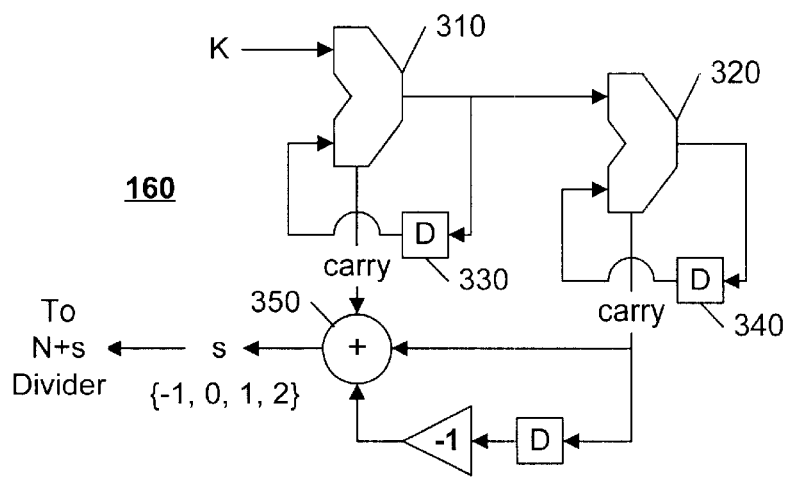
FIG. 3 illustrates an example block diagram of a prior art second-order sigma-delta calculator.
Figure 4:
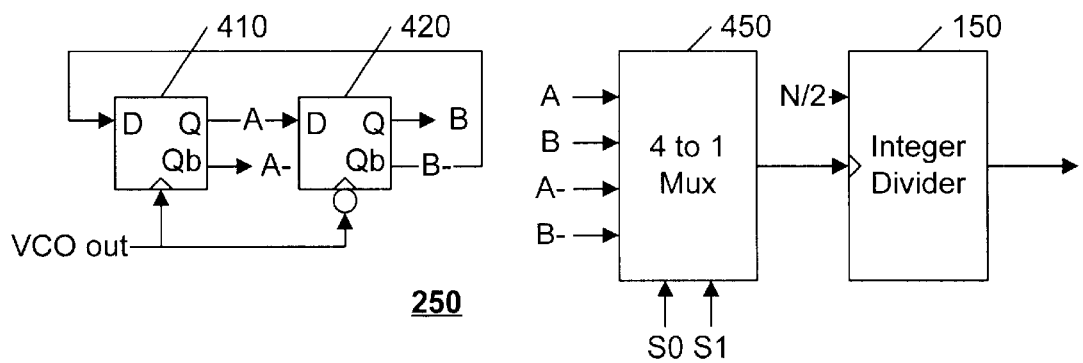
FIG. 4 illustrates an example block diagram of a half-cycle divider for use with a second-order sigma-delta calculator in accordance with this invention.

As noted above, higher order sigma-delta calculators are commonly used in conventional synthesizers. FIG. 3 illustrates a conventional second-order sigma-delta calculator, and FIG. 4 illustrates a preferred embodiment of a half-cycle divider that is particularly well suited for use in a fractional-N divider in accordance with this invention. For ease of reference, the second-order sigma-delta calculator is labeled as reference item 160, indicating that it may be used as the sigma-delta calculator 160 in FIG. 2, although any of a number of different configurations, common in the art, may alternatively be employed. For example, the sigma-delta calculator 160 may be a first-order calculator, a third, fourth, or higher order calculator, and so on. In like manner, the half-cycle divider is labeled as reference item 250, indicating that it may be used as the half-cycle divider 250 in FIG. 2, although any of a number of different configurations may alternatively be employed to effect a direct fractional division, as will be evident to one of ordinary skill in the art in view of this disclosure.

Figure 1:
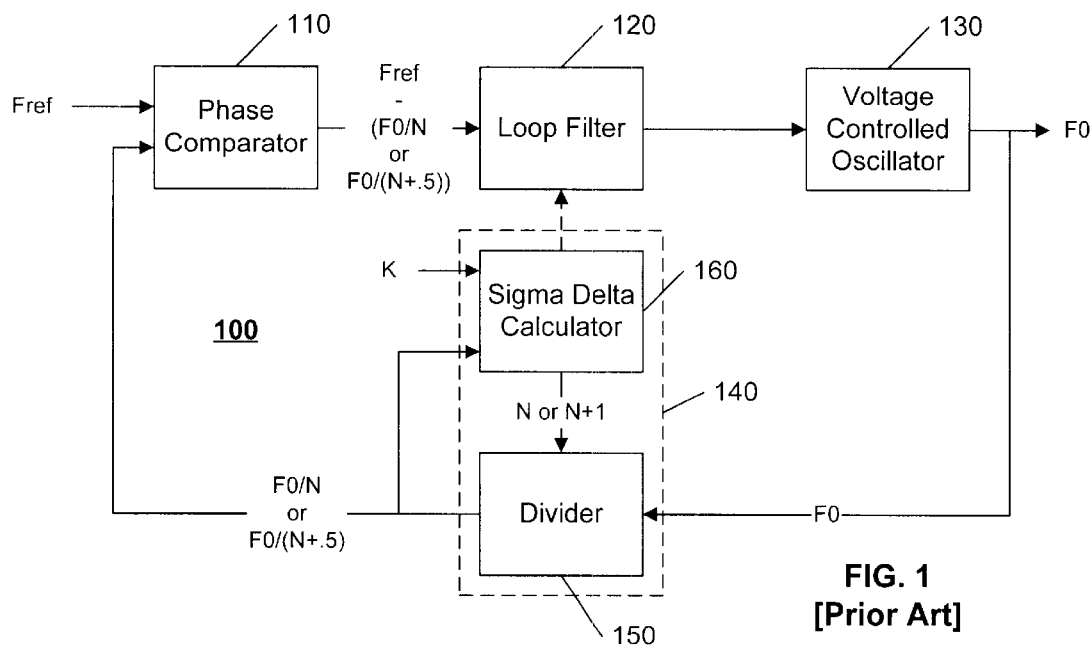
FIG. 1 illustrates an example block diagram of a prior art sigma-delta fractional-N frequency synthesizer.

The prior art second-order sigma-delta calculator 160 of FIG. 3 includes two accumulators 310, 320, that are each configured to provide a carry signal that is used to generate an output symbol S, which is conventionally used in an N+S divider, such as the divider 150 of FIG. 1. As indicated by the delay blocks 330 and 340, at each cycle, the prior output of the accumulators 310, 320, are each fed back to form an input for the next cycle. In this manner, the accumulators 310, 320 continue to accumulate an intermediate sum, based on the fractional component K that is input to the first accumulator 310. The value of K and the size of the accumulated sum are set such that a carry signal is generated systematically, corresponding to an accumulated 360 degree phase shift between the frequency-divided output and the intended fractional output, so as to enable the generation of a different divisor, to provide the aforementioned "catch-up" period. The summing device 350 provides an output that can be one of four values:−1, 0, +1, and +2. In a conventional frequency synthesizer, this output is provided to an N+S divider, so that the input signal from the voltage-controlled oscillator is selectively divided by N−1, N, N+1, or N+2, respectively. Each higher order sigma-delta calculators includes an additional accumulator-delay stage, in cascade.

Figure 5:
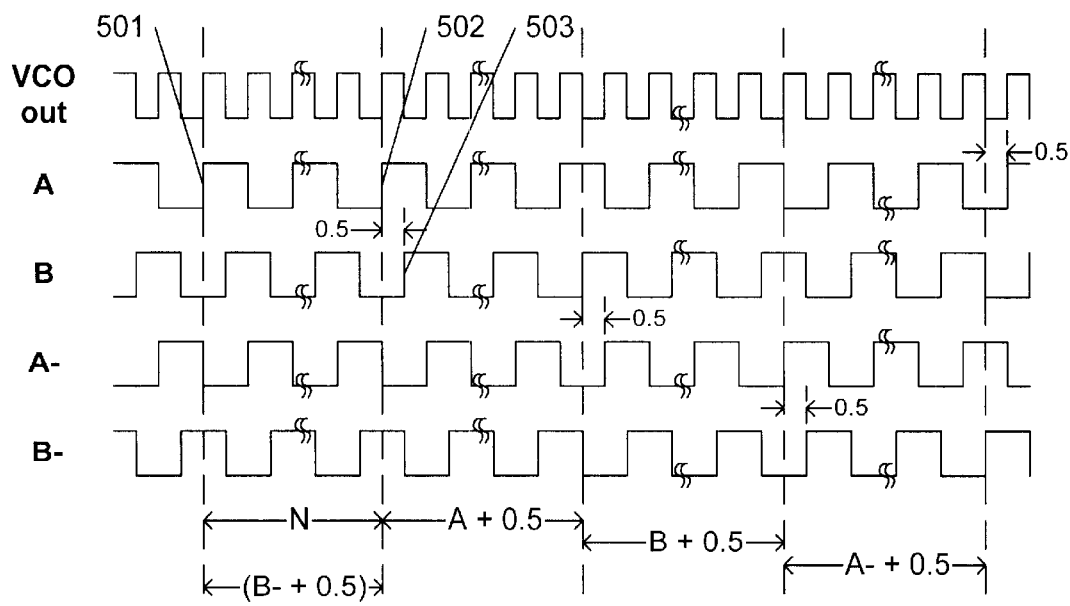
FIG. 5 illustrates an example timing diagram of a half-cycle divider in accordance with this invention.

The half-cycle divider 250 of FIG. 4 includes a pair of divide-by-2 elements 410, 420 that are operated out of phase with each other. The inverted output of one of the divide-by-2 elements 420 is provided as an input to the other divide-by-2 element 410, so as to generate a periodic clock signal from each element 410, 420, as illustrated in the timing diagram of FIG. 5 by the lines identified as A and B, and their complements, A− and B−. To effect a direct fractional division, in half-cycle increments, a multiplexer 450 is configured to select one of the outputs (A, A−, B, or B−) of the elements 410, 420 as the input to a conventional divide-by N counter. Using the positive rising edge 501 of signal A as a reference, the span to the next rising edge 502 of signal A is illustrated as N cycles of the VCO out signal. As illustrated, the next rising edge 503 of signal B is delayed by a half-cycle from the rising edge of signal A. When the calculator 160 indicates that a half-cycle span is required, the multiplexer 450 is configured to select signal B, or signal B−, each of which are offset by a half-cycle from signal A. The determination of the integer portion of the span is used in combination with the selected signal B or B− to determine the appropriate span. That is, for example, a span of N+0.5 can be implemented using an integer span of N and a half-cycle lag of 0.5, or, using an integer span of N+1 and a half-cycle lead of 0.5 (N +1−0.5). Illustrated in FIG. 5 is a sequence of continuous N+0.5 cycles, wherein the selection of outputs by the multiplexer 450 in an A to B to A− to B− order. If an integer span is required, the multiplexer 450 retains the selection of the prior output signal.

Figure 6:
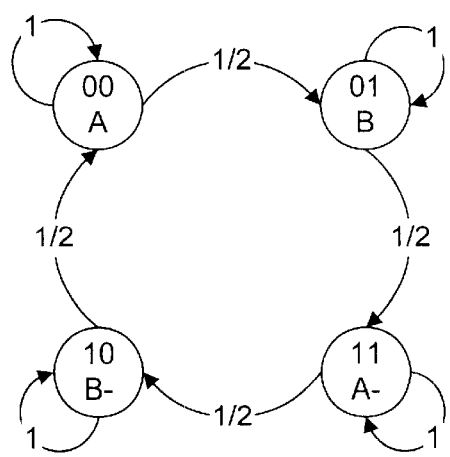
FIG. 6 illustrates an example state diagram for selecting intermediate clocking signals for achieving half-cycle resolution in accordance with this invention.

Illustrated in FIG. 6 is an example state diagram that can be used to control the selection of the signals A, A−, B, B− by the multiplexer 450. At any point in time, the system may be in any one of the states 00, 01, 11, or 10, corresponding to a current selection of either signal A, B, A−, and B−. When the calculator indicates a full integer span, the system remains in its current state, and the integer value is set to the appropriate integer. When the calculator 160 indicates a half-cycle fractional component in the span, the system changes to the next state, thereby providing the half-cycle duration that is combined with the appropriate integer number of full-cycle durations to provide the required span. Each time the calculator 160 calls for a span with a half-cycle component, the system advances to the next state; each time the calculator calls for a span with no half-cycle component, the system remains in its current state.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the invention is presented herein in the context of a frequency synthesizer, other devices that conventionally use a combination of integer divisions with different divisors to effect an indirect fractional division will also benefit from the use of a fractional divider that provide an incremental step size between alternative divisors of less than one, and particularly an incremental step size corresponding to a half-cycle of the signal being divided. Such applications and/or alternative configurations are within the spirit and scope of the following claims.

I claim:

1. A frequency synthesizer comprising:
   a comparator that is configured to compare a first signal to a second signal, and to provide a difference signal, a signal generator, operably coupled to the comparator, that is configured to provide a third signal, based on the difference signal, and a divider, operably coupled to the signal generator and the comparator, that is configured to frequency-divide the third signal to produce the second signal and is configured to provide the second signal based on a fractional division of the third signal, wherein the divider includes:
  a sigma-delta calculator that is configured to provide a control signal for the selection of a divisor, and
  a fractional divider, operably coupled to the sigma-delta calculator, that is configured to provide the fractional division via a selection from among the plurality of signals, based on the control signal corresponding to a frequency-division of the third signal with the divisor.

2. The frequency synthesizer of claim 1, wherein the fractional division corresponds to a half-cycle division.

3. The frequency synthesizer of claim 1, wherein the divider is configured to provide the fractional division via a selection from among a plurality of intermediate signals, each intermediate signal of the plurality of intermediate signals having a different phase relationship to the third signal.

4. The frequency synthesizer of claim 1, wherein the selection of a divisor is from among a plurality of divisors that includes at least one divisor having a fractional component of 0.5.

5. The frequency synthesizer of claim 1, wherein the fractional divider includes:
  a first divide-by-2 device that is configured to divide the third signal based on a first phase of the third signal, and to produce a first output, and
  a second divide-by-2 device that is configured to divide the third signal based on a second phase of the third signal, and to produce a second output,
  a selector that is configured to select a select output from among at least the first output and the second output, and
  an integer divider, operably coupled to the selector, that is configured to effect the fractional division via an integer division of the select output.

6. The frequency synthesizer of claim 5, wherein the first and second divide-by-2 devices are further configured to provide a first complementary output and a second complementary output, respectively, and the selector is further configured to select the select output from among at least the first and second complementary outputs.

7. The frequency synthesizer of claim 6, wherein the sigma-delta calculator corresponds to at least one of:
  a second-order sigma-delta calculator, and
  a third-order sigma-delta calculator.

8. The frequency synthesizer of claim 1, further including a loop filter, operably coupled between the comparator and the signal generator, that is configured to filter the difference signal to provide a filtered output to the signal generator.

9. A method of synthesizing an output signal having an output frequency that is a fractional multiple of an input frequency of an input signal, comprising:
  determining a first divisor from among a set of divisors,
  determining a second divisor from among the set of divisors,
  selectively frequency-dividing the output signal by a select divisor corresponding to either the first divisor or the second divisor, based on the fractional multiple, to produce a frequency-divided signal,
  comparing the frequency-divided signal to the input signal, to produce a difference signal, and
  generating the output signal based on the difference signal,
  wherein
    the set of divisor includes at least one non-integer divisor.

10. The method of claim 9, wherein the at least one non-integer divisor has a fractional component of 0.5.

11. The method of claim 9, wherein frequency-dividing the output signal includes:
  generating a plurality of intermediate signals,
    each intermediate signal of the plurality of intermediate signals having a different phase relationship to the output signal,
  selecting a select signal from among the plurality of intermediate signals, based on a fractional component of the selected divisor, and
  dividing the select signal by an integer amount, based on an integer component of the selected divisor, to produce the frequency-dividing signal.

* * * * *